United States Patent
Hupp et al.

(10) Patent No.: US 9,236,194 B2
(45) Date of Patent: Jan. 12, 2016

(54) METAL OXIDE-ENCAPSULATED DYE-SENSITIZED PHOTOANODES FOR DYE-SENSITIZED SOLAR CELLS

(71) Applicant: Northwestern University, Evanston, IL (US)

(72) Inventors: Joseph T. Hupp, Northfield, IL (US); Ho-Jin Son, Evanston, IL (US)

(73) Assignee: Northwestern University, Evanston, IL (US)

(*) Notice: Subject to any disclaimer, the term of this patent is extended or adjusted under 35 U.S.C. 154(b) by 278 days.

(21) Appl. No.: 13/767,270

(22) Filed: Feb. 14, 2013

(65) Prior Publication Data

US 2014/0020745 A1 Jan. 23, 2014

Related U.S. Application Data

(60) Provisional application No. 61/600,252, filed on Feb. 17, 2012.

(51) Int. Cl.
| | |
|---|---|
| *H01G 9/20* | (2006.01) |
| *H01G 9/00* | (2006.01) |
| *H01L 51/00* | (2006.01) |

(52) U.S. Cl.
CPC ............ *H01G 9/2031* (2013.01); *H01G 9/0029* (2013.01); *H01G 9/2036* (2013.01); *H01L 51/0061* (2013.01); *Y02E 10/542* (2013.01)

(58) Field of Classification Search
CPC .......................... H01G 9/2031; H01G 9/0029
USPC .................................................. 136/263, 256
See application file for complete search history.

(56) References Cited

U.S. PATENT DOCUMENTS

2006/0174936 A1* 8/2006 Di Palma et al. ............. 136/263
2010/0200051 A1 8/2010 Triani et al.

OTHER PUBLICATIONS

Hanson et al., "Stabilization of [Ru(bpy)2(4,4'-(PO3H2)bpy)]2+ on Mesoporous TiO2 with Atomic Layer Deposition of Al2O3", Chemistry of Materials, vol. 25, (2013), pp. 3-5.*
Konti et al., "Influence of pyridine ligand nature and the corresponding ruthenium(II) dye molecular structure on the performance of dye-sensitized solar cells", Photochemical & Photobiological Sciences, vol. 8, (2009), pp. 726-732.*
Rose et al., "The band gap of ultrathin amorphous and well-ordered Al 2 O 3 films on CoAl(100) measured by scanning tunneling spectroscopy", Journal of Applied Physics, vol. 105, (2009), 07C902-1-07C902-3.*

(Continued)

*Primary Examiner* — Golam Mowla
*Assistant Examiner* — Tae-Sik Kang
(74) *Attorney, Agent, or Firm* — Bell & Manning, LLC

(57) ABSTRACT

Dye-sensitized semiconducting metal oxide films for photoanodes, photoanodes incorporating the films and DSCs incorporating the photoanodes are provided. Also provided are methods for making the dye sensitized semiconducting metal oxide films. The methods of making the films are based on the deposition of an encapsulating layer of a semiconducting metal oxide around the molecular anchoring groups of photosensitizing dye molecules adsorbed to a porous film of the semiconducting metal oxide. The encapsulating layer of semiconducting metal oxide is formed in such a way that it is not coated over the chromophores of the adsorbed dye molecules and, therefore, allows the dye molecules to remain electrochemically addressable.

19 Claims, 3 Drawing Sheets

(56) References Cited

OTHER PUBLICATIONS

Son et al., Glass-Encapsulated Light Harvesters: More Efficient Dye-Sensitized Solar Cells by Deposition of Self-Aligned, Conformal, and Self-Limited Silica Layers, J. Am. Chem. Soc., vol. 134, Jun. 1, 2012, pp. 9537-9540.

Antila et al., Suppression of Forward Electron Injection from $Ru(dcbpy)_2(NCS)_2$ to Nanocrystalline $TiO_2$ Film As a Result of an Interfacial $Al_2O_3$ Barrier Layer Prepared with Atomic Layer Deposition, J. Phys. Chem. Lett., vol. 1, Dec. 29, 2009, pp. 536-539.

Klahr et al., Performance Enhancement and Limitations of Cobalt Bipyridyl Redox Shuttles in Dye-Sensitized Solar Cells, J. Phys. Chem. C, vol. 113, No. 31, Jul. 1, 2009, pp. 14040-14045.

Lin et al., Enhanced performance of dye-sensitized solar cells by an $Al_2O_3$ charge-recombination barrier formed by low-temperature atomic layer deposition, J. Mater. Chem., vol. 19, Mar. 17, 2009, pp. 2999-3003.

Shanmugam et al., Effect of atomic layer deposited ultra thin $HfO_2$ and $Al_2O_3$ interfacial layers on the performance of dye sensitized solar cells, Thin Solid Films, vol. 518, Aug. 26, 2009, pp. 2678-2682.

Park et al., Effect of an Ultrathin $TiO_2$ Layer Coated on Submicrometer-Sized ZnO Nanocrystallite Aggregates by Atomic Layer Deposition on the Performance of Dye-Sensitized Solar Cells, Adv. Mater., vol. 22, Apr. 7, 2010, pp. 2329-2332.

Prasittichai et al., Surface Modification of $SnO_2$ Photoelectrodes in Dye-Sensitized Solar Cells: Significant Improvements in Photovoltage via $Al_2O_3$ Atomic Layer Deposition, J. Phys. Chem. Lett., vol. 1, May 4, 2010, pp. 1611-1615.

Law et al., Water-Based Electrolytes for Dye-Sensitized Solar Cells, Adv. Mater., vol. 22, Aug. 27, 2010, pp. 4505-4509.

Hanson et al., Stabilization of $[Ru(bpy)_2(4,4'-(PO_3H_2)bpy)]^{2+}$ on Mesoporous $TiO_2$ with Atomic Layer Deposition of $Al_2O_3$, Chem. Mater., vol. 25, Dec. 7, 2012, pp. 3-5.

* cited by examiner

METAL OXIDE-ENCAPSULATED DYE-SENSITIZED PHOTOANODES FOR DYE-SENSITIZED SOLAR CELLS

CROSS-REFERENCE TO RELATED APPLICATION

This application claims priority from U.S. provisional patent application No. 61/600,252, filed on Feb. 17, 2012, the entire contents of which is incorporated herein by reference.

REFERENCE TO GOVERNMENT RIGHTS

This invention was made with government support under DE-SC0001059 awarded by Department of Energy. The government has certain rights in the invention.

BACKGROUND

Dye-sensitized solar cells (DSCs) have great potential to compete with conventional p-n junction solar cells due to their relatively low-cost. However, one practical limitation of existing DSC designs is the tendency, over time, for dyes to detach (desorb) from the photoelectrode. Once detached, these sensitizers no longer contribute to the cell's photocurrent, thereby resulting in lower cell performance. This behavior is thought to be due to competitive adsorption of water, which may enter the cell over time via capture of moisture from air surrounding the cell. A second practical problem is the degradation of cell performance (energy conversion efficiency) when a conventional redox-electrolyte-containing organic solvent is replaced by water. The performance shortfall is thought primarily to reflect problems in getting aqueous solutions to completely permeate high-area, mesoporous photoelectrodes. Nevertheless, the ability to use water as the cell solvent would reduce materials costs and make the cells greener by eliminating hazards associated with disposal or leakage.

SUMMARY

Dye-sensitized semiconducting metal oxide films, methods of making the dye-sensitized semiconducting metal oxide films and dye-sensitized solar cells incorporating the films as photoanode materials are provided.

One embodiment of a dye-sensitized semiconducting metal oxide film comprises: (a) a porous film comprising a semiconducting metal oxide, the porous film having a surface; (b) photosensitizing dye molecules adsorbed onto the surface of the porous film, the photosensitizing dye molecules comprising a chromophore and a molecular anchoring group, wherein the molecular anchoring group attaches the dye molecule to the porous film; and (c) an encapsulating layer of the semiconducting metal oxide, wherein the encapsulating layer at least partially encapsulates the molecular anchoring groups, but does not cover the chromophores.

One embodiment of a dye-sensitized solar cell comprises: (a) a photoanode comprising a transparent conductive substrate and a film disposed on a surface of the transparent conductive substrate; (b) a counter electrode comprising an electrically conductive material in electrical communication with the photoanode; and (c) a redox electrolyte disposed between, and in electrical communication with, the photoanode and the counter electrode. In this embodiment, the photoanode film comprises: (i) a porous film comprising a semiconducting metal oxide, the porous film having a surface; (ii) photosensitizing dye molecules adsorbed to the surface of the porous film, the photosensitizing dye molecules comprising a chromophore and a molecular anchoring group, wherein the molecular anchoring group attaches the dye molecule to the porous film; and (iii) an encapsulating layer of the semiconducting metal oxide, wherein the encapsulating layer at least partially encapsulates the molecular anchoring groups, but does not cover the chromophores A method of making a dye-sensitized semiconducting metal oxide films comprises the steps of: (a) adsorbing photosensitizing dye molecules onto the surface of a porous film comprising a semiconducting metal oxide, the photosensitizing dye molecules comprising a chromophore and a molecular anchoring group, wherein the molecular anchoring group attaches the dye molecule to the porous film; and (b) depositing a layer of the semiconducting metal oxide on the porous film via atomic-layer-deposition, such that the encapsulating layer at least partially encapsulates the molecular anchoring groups, but does not cover the chromophores.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

DETAILED DESCRIPTION

Figure 1:
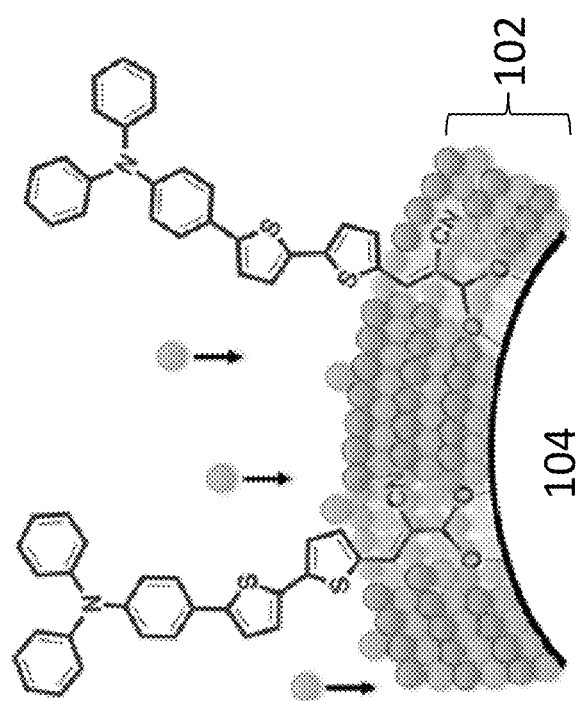
FIG. 1. Schematic diagram of the ALD deposition of a metal oxide encapsulating layer on a metal oxide nanoparticle, highlighting the layer-by-layer nature of the deposition process.
Figure 1:
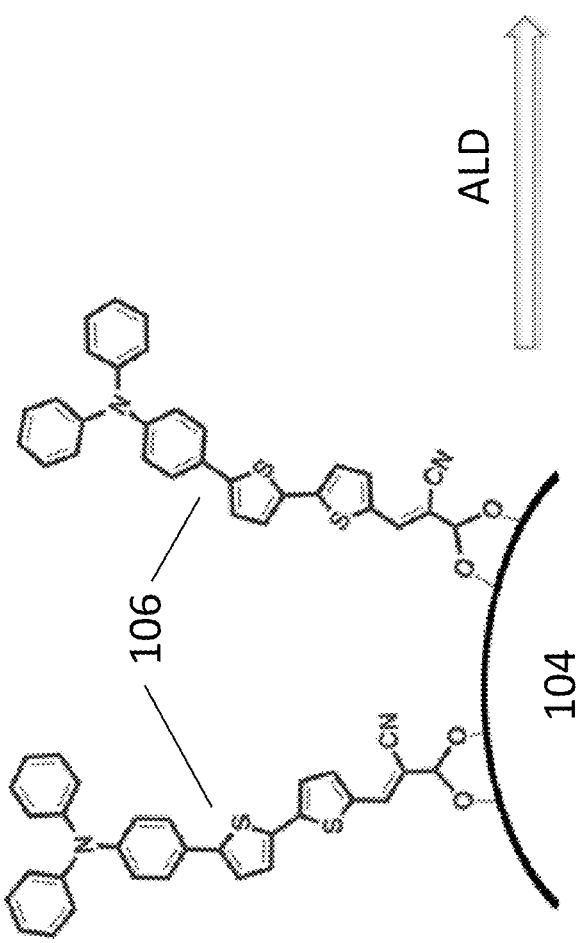

Dye-sensitized semiconducting metal oxide films for photoanodes, photoanodes incorporating the films and DSCs incorporating the photoanodes are provided. Also provided are methods of using the DSCs to convert solar radiation into electricity and methods for making the dye sensitized semiconducting metal oxide films.

The methods of making the films are based on the deposition of an encapsulating layer of a semiconducting metal oxide, such as titanium dioxide ($TiO_2$), around the molecular anchoring groups of photosensitizing dye molecules attached to the surface of an electrode comprising a porous film of the semiconducting metal oxide. The encapsulating layer of semiconducting metal oxide is formed in such a way that it is not coated over the chromophores of the adsorbed dye molecules and, therefore, allows the dye molecules to remain electrochemically addressable. The methods utilize atomic-layer-deposition (ALD) to form a conformal coating of the semiconducting metal oxide on the surface of the porous film and around at least a portion of the molecular anchoring groups of the attached dye molecules. The use of ALD is advantageous due to its remarkably conformal coating behavior, its comparatively low deposition-temperature requirements (i.e., typically less than 150° C.), and its high resolution with regard to thicknesses of deposited layers.

The encapsulating layer enhances the desorption stability of the attached dye molecules relative to the desorption stability of the attached dye molecules in the absence of the encapsulating layer. In addition, the encapsulating layer increases the hydrophilicity of the dye-sensitized semiconducting metal oxide films by bring the surface of the semiconducting metal oxide closer to the chromophores of the attached dye molecules. As a result, an aqueous solution in contact with the dye-sensitized semiconducting metal oxide film does not have to penetrate as far through the dye layer, which is typically hydrophobic, before coming into contact with the surface of the semiconducting metal oxide, which is more hydrophilic. This enhanced hydrophilicity renders the dye-sensitized semiconducting metal oxide films well-suited for use as electrodes in dye-sensitized solar cells having aqueous electrolytes.

Without intending to be bound to any particular theory of the invention, it is believed that the encapsulating layer of metal-oxide material may protect the molecular anchoring groups against displacement by physically blocking water molecules or hydroxide ions from reaching the anchoring site, and/or by enabling an anchoring oxygen atom (e.g., from a carboxylate anchoring group) to interact with multiple metal cations.

The semiconducting metal oxide of the porous film can be, for example, a semiconductor material with a high bandgap, such that it is capable of transporting photo-excited electrons, injected from the adsorbed dye molecules, to a collector. The porous film is desirably highly porous so that it provides a large surface area for dye loading. High surface area porous films can be comprised of, for example, metal oxide nanoparticles. For the purposes of this disclosure, the term nanoparticles refers to a collection of particles having a nominal average diameter of no greater than about 1000 nm. This includes particles having a nominal average diameter of no greater than about 500 nm, no greater than about 100 nm and no greater than about 50 nm. The porous film is typically quite thin with a thickness of, for example, 20 µm or less.

Titanium dioxide is an example of a semiconducting metal oxide from which the porous film can be formed and which can be deposited as an encapsulating layer via ALD. However, the porous film and the encapsulating layer may be comprised of (or may consist of, or consist essentially of) other semiconducting metal oxides, such as zinc oxide (ZnO) and tin oxide ($SnO_2$). Mixtures of these metal oxides may also be used.

The photosensitizing dye molecules adsorbed onto the surface of the semiconducting metal oxide film can be, for example, metal-containing organic dye molecules, such as metalloporphyrins or ruthenium complexes. Alternatively, the dye molecules can be metal-free organic molecules, such as coumarins, indolines, oligoenes, merocyanines, hemicyanines, oligothiophenes, functionalized thiophenes, squaraines, benzothiadiazoles, perylenetetracarboxylic acid derivatives, diphenylaminostyrenes, phthalocyanines, and croconaine. The coating formed by the dye molecules is typically a monolayer coating. Molecular anchoring groups that may be used in the photosensitizing dye molecules include carboxylate groups, tetramethylsilane groups, cyanoacrylic acid groups, $SO_3H$ groups and $PO_3H$ groups (phosphonate groups), acetyl-acetonate groups, and hydroxamate groups.

The dye-sensitized semiconducting metal oxide film is formed by adsorbing photosensitizing dye molecules onto the surface of a porous film comprising a semiconducting metal oxide, wherein the dye molecules comprise chromophore groups and molecular anchoring groups linking the chromophore groups to the porous film, and further wherein interstices exist between the molecular anchoring groups. Subsequently, a layer of the semiconducting metal oxide is deposited on the porous film via atomic-layer-deposition, such that the encapsulating layer at least partially, and in some embodiments entirely, encapsulates the molecular anchoring groups, but does not cover the chromophores of the photosensitizing dye molecules. The atomic-layer-deposition is a layer-by-layer deposition process in which the porous film is repeatedly and sequentially exposed to metal-containing precursor molecules and oxygen-containing precursor molecules which react to form a metal oxide, typically under elevated temperatures. The resulting metal oxide layer has a substantially uniform thickness that is conformal with the underlying porous metal oxide surface. The thickness of the encapsulating layer is desirably no greater than the height of the molecular anchoring groups on the dye molecules, such that the layer may extend up to but does not cover the chromophore groups. In some embodiments, the encapsulating layer has a thickness of no greater than about 5 nm (e.g., from about 0.5 to about 4 nm or from about 1 to about 3 nm). FIG. 1 is a schematic diagram showing the atomic-layer-deposition of an encapsulating layer of semiconducting metal oxide 102 on portion of a dye-sensitized metal oxide film, which is represented by a metal oxide nanoparticle 104. In this embodiment, the dye 106 is a thiophene dye having a terminal aryl amine substitution and the molecular anchor comprises a carboxylate group that is completely encapsulated by the encapsulating layer. As shown in the diagram the encapsulating layer extends around, and fills-in the interstices between, the molecular anchors of the dye molecules, such that the molecular anchoring group is embedded in the metal oxide.

The photoanodes comprising the coated metal oxide thin films can be incorporated into a DSC. In one embodiment, the resulting DSC comprises: (a) a photoanode comprising a transparent conductive substrate, such as a transparent conductive oxide substrate, and a dye-sensitized, porous semiconducting metal oxide film disposed on a surface of the transparent conductive substrate, wherein the film comprises an encapsulating layer of the semiconducting metal oxide at least partially encapsulating the molecular anchoring groups, but not covering the chromophores of the dye molecules; (b) a counter electrode comprising an electrically conductive material (e.g., a Pt electrode) in electrical communication with the photoanode; and (c) a redox electrolyte disposed between, and in electrical communication with, the photoanode and the counter electrode.

The electrolyte typically comprises a redox active salt and a solvent. Organic solvents may be used in some embodiments of the DSCs. However, because the encapsulating layers enhance the hydrophilicity of the photoanodes, the photoanodes are well-suited for use in DSCs that use water as the electrolyte solvent—that is, aqueous electrolytes.

Compared to DSCs that have the same structure except that the photoanode lacks the encapsulating layer, the present DSCs are able to provide improved performance including higher open-circuit photovoltage, improved short-circuit photocurrent and higher solar to electrical conversion efficiencies. For example, in some embodiments the DSCs provide short-circuit photocurrent densities and/or electrical conversion efficiencies of at least 25% (e.g., from about 25% to about 40%).

EXAMPLE

Figure 2:
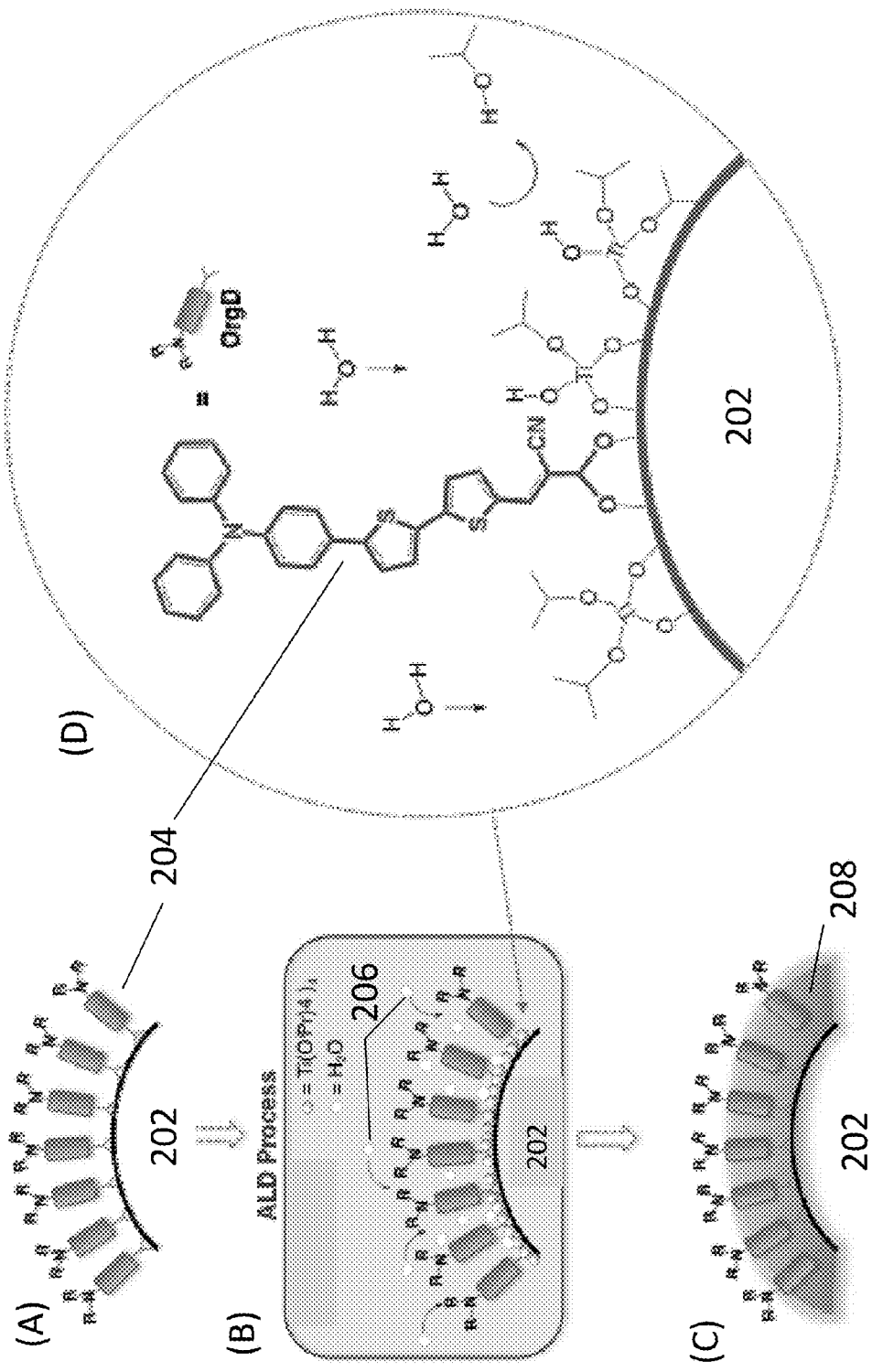
FIG. 2 is a schematic diagram showing the post-assembly atomic-layer-deposition of the $TiO_2$ encapsulating layer on a $TiO_2$ nanoparticle-based electrode.

This example illustrates how a $TiO_2$ encapsulating layer on a dye-sensitized $TiO_2$ anode reduces the desorption of dye molecules and thereby improves the performance of photovoltaic devices. FIG. 2 is a schematic diagram showing the post-assembly atomic-layer-deposition of the $TiO_2$ encapsulating layer on a TiO$_2$ nanoparticle-based electrode. Panel (A) of FIG. 2 is a representation of a metal oxide nanoparticle 202 surface that has been photosensitized with a layer of dye molecules 204. Panel (B) shows the initial stages of the ALD process in which metal- and oxygen-containing precursor molecules 206 are being deposited onto the nanoparticle surface. Panel (C) is an illustration of the resulting ALD encapsulating layer 208, which extends up to the termini of, but does not cover, the chromophores of the dye molecules. The enlarged inset of panel (D) shows the structure of the dye molecules, including the anchoring groups, and the metal oxide ALD layer.

Materials and Methods:

Preparation of OrgD-Containing Photoanodes and Post-ALD Treatment: The organic dye (OrgD) was synthesized and purified as published. (K. R. Justin Thomas, K. R.; Hsu, Y.-C.; Lin, J. T.; Lee, K.-M.; Ho, K.-C.; Lai, C.-H.; Cheng, Y.-M.; Chou, P.-T. *Chem. Mater.* 2008, 20, 1830.) Fluorine-doped tin oxide (FTO) coated glass plates (Hartford Glass, TEC 15) were immersed in 40 mM TiCl$_4$ (aqueous) at 70° C. for 30 min and washed with water and ethanol. A transparent TiO$_2$ layer on the FTO glass plate was prepared by doctor blade printing a commercially available TiO$_2$ paste (avg. 20 nm, Dyesol, DSL-90-T) and then drying the paste for 2 h at 25° C. The TiO$_2$ electrodes were gradually heated under flowing air at 325° C. for 15 min, at 375° C. for 15 min, at 450° C. for 15 min, and at 500° C. for 15 min. The resulting layer was a 6 μm thick transparent layer. The active section of the photoelectrode was then geometrically defined by using a razor blade to remove material that would fall outside of the intended illumination area. This step eliminated artifacts (overly large photocurrents) due to light leakage onto portions of the electrode that were not intentionally illuminated. The photoelectrodes were treated again with TiCl$_4$ at 70° C. for 30 min and sintered at 500° C. for 30 min. Dye adsorption was accomplished by soaking the TiO$_2$ films in a 0.3 mM suspension solution (THF/EtOH=1/4) of OrgD. After 12 h, the films were soaked in clean THF for 1 hour to remove the aggregated/unanchored dye molecules, washed with copious amount of the above solvent, and dried with a nitrogen stream.

TiO$_2$ ALD post-coating was performed with a Savannah 100 instrument (Cambridge Nanotech Inc.), using titanium tetraisopropoxide (TTIP) and distilled water as a titanium and an oxygen source, respectively. TiO$_2$ was grown at 110° C. using reactant exposure times of 8 and 5 s for TTIP and water, respectively, and nitrogen purge times of 30 s between exposures. The growth rate of TiO$_2$ on flat platforms, as determined by ellipsometry, was 0.96 Å/cycle; it was assumed that the growth rate on the TiO$_2$ nanoparticles was identical with the ellipsometry result. Once the ALD deposition was completed, the partially-completed solar cells were cooled in dried nitrogen to near room temperature before their removal from the deposition chamber. The treated samples were kept in vacuum after the TiO$_2$ ALD deposition until the remainder of the cell construction was completed by adding the electrolyte and the back contact. This handling procedure protected the dye from contamination and/or oxidation by the ambient air.

Assembly of Photovoltaic Cells: Cathode/anode pairs were combined in each case with a 60-μm-thick Surlyn polymer film (Surlyn-1702, Dupont) that served as a spacer and defined the perimeter of a photoelectrochemical sealing. The components were permanently combined by placing them on a hotplate at 90° C. and allowing the spacer to melt slightly. Tin-coated copper wires were connected to each electrode with silver epoxy. ~30 μL of the electrolyte-containing solution was drop-casted onto the drilled hole on the back side of the platinized cathode and then vacuum-loaded into the cell. After residual electrolyte around the hole was removed, the hole was sealed by melting a sheet of Surlyn polymer film that was inserted between the backside of the FTO and a micro cover glass slide. Finally, a photo-mask (black tape) as an aperture was applied on top of the active area of each cell.

Preparation of Dye-Sensitized TiO$_2$ Film for UV-Vis Spectroscopic and Electrochemical Measurement: the samples for UV-vis measurement were mesoporous thin films (~3 μm) of TiO$_2$ nanoparticles. A transparent TiO$_2$ layer on the ITO or glass plate was prepared by doctor blade printing commercially available TiO$_2$ paste (avg. 20 nm, Dyesol, DSL-90-T) and then drying for 2 h at 25° C. The TiO$_2$ electrodes were gradually heated under flowing air at 325° C. for 15 min, at 375° C. for 15 min, at 450° C. for 15 min, and at 500° C. for 15 min. The resulting slides were sensitized by submerging the film in a 0.3 mM solution of OrgD or N719 for 2 hour. The sensitized films were rinsed with THF or CH$_3$CN and dried under a stream of N$_2$ gas.

Electrochemical Measurements: Cyclic voltammetry experiments were carried out with a CHI900 instrument (CH Instruments, Inc.) using three electrode cell assemblies. OrgD-sensitized TiO$_2$ film and Pt wire were used for the working and counter electrode, respectively. An Ag/AgNO$_3$ couple was employed as a reference electrode. Measurements were carried out in nitrogen-saturated CH$_2$Cl$_2$ (10 mL) with tetra-n-butylammoniumhexafluorophosphate (Bu$_4$NPF$_6$) as a supporting electrolyte (0.1 M) at a scan rate of 100 mV/s. For measurement in water, potassium phosphate mono-basic-sodium hydroxide buffer solution (0.05 M) was used as solvent. An Ag/AgCl couple (in saturated KCl solution) was employed as reference electrode.

Instrumentation: UV-Vis spectra of samples were recorded on a Varian Cary 5000 UV-VIS-NIR spectrophotometer. The photocurrent-density-to-applied-voltage (J-V) curves and IPCE curves of photovoltaic cells were obtained using a home-made set-up which consists of xenon lamp, an AM 1.5 light filter, and a CHI 1202 Electrochemical Analyzer (CHI instruments). The power of filtered light was calibrated with an optical power meter (OPM) and adjusted to 100 mW/cm$^2$.

Results:

TiO$_2$ was selected as the encapsulating layer material due to its extraordinary chemical stability, even under extremes of pH condition; its shielding/scavenging activity toward humidity and oxygen; and its compositional matching with the underlying electrode.

The intensity of the broad visible-region absorption spectrum of OrgD on nanoparticulate TiO$_2$ films was not significantly altered by subsequent ALD of additional TiO$_2$—implying that the dye was not degraded by the metal-oxide formation process. However, the OrgD absorbance wavelength maximum, $\lambda_{max}$, was affected. The peak shifted to the red by about 2 nm per ALD cycle for the first ten cycles, with little additional shifting occurring thereafter. In view of the donor-acceptor character of OrgD, significant shifts in $\lambda_{max}$ can be expected whenever the polarity or dielectric strength of the local environment is altered. Here the initial environment (presumably vacuum+neighboring dye molecules) was changed to TiO$_2$, a high-dielectric semiconductor. Assuming a TiO$_2$ growth rate of 1 Å per ALD cycle, the spectral results suggest that OrgD was largely encapsulated when the thickness of the ALD coating reached 10 Å. Additional experiments (cyclic voltammetry) showed that OrgD remained electrochemically addressable after ALD treatment, with essentially no change in the magnitude of the transient current associated with dye oxidation.

The modified structures (TiO$_2$:OrgD/8 TiO$_2$ ALD) were examined to assess their ability to resist dye loss to solution. Although water is the nominal culprit, the competitive adsorbate instead may be the hydroxide ion. Commonly included at high concentration (~0.5 M) in nonaqueous electrolyte solutions for DSCs, because of its propensity to suppress dark currents, is tert-butyl-pyridine (TBP). As a reasonably effective Brönsted base, TBP can be expected to extract protons and convert any residual or moisture-derived water molecules in DSC solutions nearly quantitatively to hydroxide ions. Therefore, accelerated tests of dye desorption could be done by employing a receiver solution of ethanol (desirable because of the typically good high solubility of organic dyes in this solvent) that had intentionally been made basic by addition of NaOH. Ideally, the acceleration protocol would cause unprotected dye molecules to be desorbed in minutes or hours rather than months or years. As detailed further below, ethanolic solutions with apparent pH of ~10.7 proved suitable (i.e., 0.5 mM NaOH).

Visible-region absorption spectra for TiO$_2$:OrgD/8 TiO$_2$ ALD and TiO$_2$:OrgD, respectively, were obtained following soaking in the basic ethanol solution for times ranging from 0 to 72 hours. The absorbance at various times t relative to the initial absorbance (i.e. $A_t/A_0$) was graphed and the unprotected dye could be seen to desorb much more rapidly than the ALD-protected version. After 24 hours the initially intense orange TiO$_2$:OrgD electrode had become pale yellow, while TiO$_2$:OrgD/8 TiO$_2$ ALD assembly remained strongly colored. A comparison of approximate half lives for dye loss showed that treatment of an electrode with 8 ALD cycles of TiO$_2$ slowed the desorption process by about one-and-a-half orders of magnitude, i.e. roughly 50-fold.

The stabilizing effect of the ALD TiO$_2$ encapsulating layer against dye desorption extended to the ruthenium-based dye, N719, using water as the solvent—albeit, to a lesser degree than observed with OrgD in basic ethanol.

Figure 3:
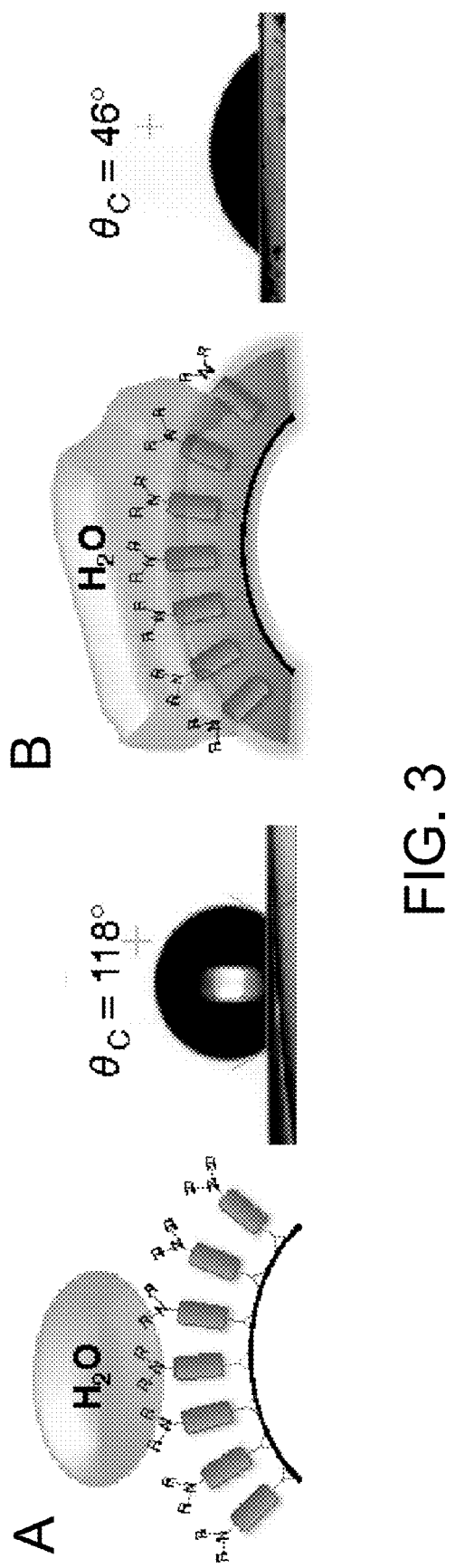
FIG. 3. Photographs of a water droplet on a $TiO_2$:OrgD film (left, A) with a contact angle of 118±0.9° and a $TiO_2$:OrgD/8 $TiO_2$ ALD film (right, B) with a contact angle of 46±1.5°.

It is notable that the surface energy of TiO$_2$:OrgD photoelectrodes, as gauged by water contact-angles ($\theta_{water}$), was significantly changed by the post-assembly ALD of TiO$_2$. As illustrated by the schematic diagram in FIG. 3, prior to ALD the surface was hydrophobic, but after ALD it was hydrophilic. The initial hydrophobicity was expected, given the phenyl terminating groups of adsorbed OrgD. As suggested by the cartoons in FIG. 3, and supported by the observations above regarding asymptotic OrgD spectral shifts with increasing numbers of ALD cycles, the hydrophilic behavior of the modified electrode can be interpreted as arising from the extension of TiO$_2$ to near the dye termini via ALD-based filling of the dye-layer interstices. Thus, the aqueous solution was able to contact the metal-oxide without first penetrating the entire thickness of the dye layer. On a larger scale, local hydrophilicity should engender solution permeation of photoelectrode mesopores. In turn, a larger fraction of dye molecules should be redox-active. Indeed, although complicated by irreversibility, cyclic voltammetry experiments with hydrophobic and hydrophilic electrodes indicated a larger number of redox-active dye molecules for the hydrophilic version of the electrode.

With these differences in mind, the performance of DSCs containing either untreated or post-assembly-treated photoanodes in aqueous electrolyte were compared. Specifically, cell solutions of distilled water containing 0.05 M iodine, 2 M 1-butyl-3-methylimidazolium iodide (DMPImI), 0.1 M guanidinium thiocyanate (GuSCN), and 0.5 M TBP were used. (The higher-than-typical concentration of DMPImI was used to ensure miscibility or dissolution of other components in water.) For simplicity, thin photoelectrodes (6 μm, rather than the 10 to 12 μm thickness typically used when seeking maximum DSC efficiencies) were examined comparatively. Additionally, the TiO$_2$ light-scattering layer the goal was not to produce a champion DSC, but to understand what limited DSC performance. In the aqueous DSCs, the untreated TiO$_2$:OrgD electrodes gave a short-circuit photocurrent density ($J_{sc}$) of 3.95 mA/cm$^2$, an open-circuit photovoltage ($V_{oc}$) of 750 mV, an overall cell fill-factor (FF) of 0.70, and an overall light-to-electrical-energy conversion efficiency ($\eta$) of 2.06%. Under the same conditions, the post-assembly ALD-treated photoelectrodes yielded significantly better performance: a $J_{SC}$ value of 5.05 mA/cm$^2$, a $V_{oc}$ of 760 mV, an FF of 0.69, and an overall efficiency of 2.65%. The increased photocurrent in the ALD-treated cell can be understood in terms of enhanced access of the aqueous electrolyte to the highly porous, but initially hydrophobic, photoelectrode surface.

This example demonstrates, functional encapsulation of carboxylate-anchored photosensitizing dyes on high surface-area, nanoparticulate TiO$_2$ photoelectrodes via post-assembly atomic-layer-deposition of additional TiO$_2$ to form a TiO$_2$ encapsulating layer that at least partially encapsulates the molecular anchoring groups of the dye molecules. The ALD treatment served to isolate and protect dye anchoring groups from displacement by water molecules or hydroxide ions. As a consequence, under conditions designed to achieve rapid dye desorption (i.e., accelerated stability testing) the rate of desorption was slowed by ca. 50-fold.

The ALD treatment additionally served to make the initially hydrophobic surface of a representative organic-dye/TiO$_2$-photoelectrode assembly significantly hydrophilic. This change, in turn, facilitated permeation of the assembly's mesopores by aqueous electrolyte, boosted the fraction of adsorbed dyes that were redox accessible, and enhanced the ability of the DSC to function with water as a solvent.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more". Still further, the use of "and" or "or" is intended to include "and/or" unless specifically indicated otherwise.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A dye-sensitized semiconducting metal oxide film comprising:
(a) a porous film comprising a semiconducting metal oxide, the porous film having a surface;
(b) photosensitizing dye molecules adsorbed directly onto the surface of the porous film, each of the photosensitizing dye molecules comprising a chromophore and a molecular anchoring group, wherein the molecular anchoring group of the each of the photosensitizing dye molecules attaches the chromophore of the each of the photosensitizing dye molecules to the porous film; and (c) an encapsulating layer on the surface of the porous film, the encapsulating layer comprising the semiconducting, metal oxide, wherein the encapsulating layer at least partially encapsulates the molecular anchoring group of the each of the photosensitizing dye molecules, but does not cover chromophore of the each of the photosensitizing dye molecules the.

2. The film of claim 1, wherein the encapsulating layer extends at least up to the chromophore of the each of the photosensitizing dye molecules.

3. The film of claim 1, wherein the semiconducting metal oxide is titanium dioxide.

4. The film of claim 3, wherein the semiconducting metal oxide consists essentially of titanium dioxide.

5. The film of claim 1, wherein the encapsulating layer completely encapsulates the molecular anchoring group of the each of the photosensitizing dye molecules.

6. The film of claim 1, wherein the molecular anchoring group of the each of the photosensitizing dye molecules comprises a carboxylate group.

7. The film of claim 1, wherein the molecular anchoring group of the each of the photosensitizing dye molecules is selected from a tetramethylsilane group, a cyanoacetic acid group, a $SO_3H$ group, a $PO_3H_2$ group, an acetyl-acetonate group or a hydroxamate group.

8. The film of claim 1, Wherein the semiconducting metal oxide comprises zinc oxide.

9. The film of claim 1, wherein the semiconducting metal oxide comprises tin oxide.

10. The film of claim 1, wherein the porous film comprises nanoparticles of the semiconductor metal oxide.

11. A dye-sensitized solar cell comprising:
(a) a photoanode comprising a transparent conductive substrate and a film disposed on a surface of the transparent conductive substrate, the film comprising:
 (i) a porous film comprising a semiconducting, metal oxide, the porous film having a surface;
 (ii) photosensitizing dye molecules adsorbed to directly the surface of the porous film, each of the photosensitizing dye molecules comprising a chromophore and a molecular anchoring group, wherein the molecular anchoring group of the each of the photosensitizing dye molecules attaches the chromophore of the each of the photosensitizing dye molecules to the porous film; and
 (iii) an encapsulating layer on the surface of the porous film, the encapsulating layer comprising the semiconducting metal oxide, wherein the encapsulating layer at least partially encapsulates the molecular anchoring group of the each of the photosensitizing dye molecules, but does not cover chromophore of the each of the photosensitizing dye molecules the;
(b) a counter electrode comprising an electrically conductive material in electrical communication with the photoanode; and
(c) a redox electrolyte disposed between, and in electrical communication with, the photoanode and the counter electrode.

12. The solar cell of claim 11, wherein the encapsulating layer extends up to the chromophore of the each of the photosensitizing dye molecules.

13. The solar cell of claim 11, wherein the semiconducting metal oxide is titanium dioxide.

14. The solar cell of claim 13, wherein the semiconducting metal oxide consists essentially of titanium dioxide.

15. The solar cell of claim 11, wherein the molecular anchoring group of the each of the photosensitizing dye molecules is selected from a carboxylate group, a tetramethylsilane group, a cyanoacetic acid group, a $SO_3H$ group, a $PO_3H_2$ group, an acetyl-acetonate group or a hydroxamate group.

16. The solar cell of claim 11, Wherein the electrolyte is an aqueous electrolyte.

17. The solar cell of claim 11, wherein the semiconducting metal oxide comprises zinc oxide.

18. The solar cell of claim 11, wherein the semiconducting metal oxide comprises tin oxide.

19. The solar cell of claim 11, here n the porous film comprises nanoparticles of the semiconductor metal oxide.

\* \* \* \* \*